(12) United States Patent
Lv et al.

(10) Patent No.: US 10,121,441 B2
(45) Date of Patent: Nov. 6, 2018

(54) GOA DRIVER CIRCUIT AND LIQUID CRYSTAL DISPLAY

(71) Applicant: SHENZHEN CHINA STAR OPTOELECTRONICS TECHNOLOGY CO., LTD., Shenzhen, Guangdong (CN)

(72) Inventors: Xiaowen Lv, Guangdong (CN); Shujhih Chen, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 189 days.

(21) Appl. No.: 15/323,974

(22) PCT Filed: Dec. 20, 2016

(86) PCT No.: PCT/CN2016/111059
§ 371 (c)(1),
(2) Date: Jan. 5, 2017

(87) PCT Pub. No.: WO2018/072304
PCT Pub. Date: Apr. 26, 2018

(65) Prior Publication Data
US 2018/0182337 A1    Jun. 28, 2018

(30) Foreign Application Priority Data

Oct. 18, 2016   (CN) .......................... 2016 1 0903103

(51) Int. Cl.
*G09G 3/36*    (2006.01)
(52) U.S. Cl.
CPC ................................. *G09G 3/3677* (2013.01)
(58) Field of Classification Search
CPC ................................................... G09G 3/3677
See application file for complete search history.

*Primary Examiner* — Robin Mishler
(74) *Attorney, Agent, or Firm* — Soroker Agmon Nordman

(57) ABSTRACT

A gate driver on array (GOA) driver circuit and a liquid crystal display are proposed. The GOA driver circuit includes cascaded GOA units. The Nth-stage GOA unit includes a pull-up module, a pull-up control module, a pull-down holding module, a transferring module, and a bootstrap capacitor module. The pull-up module, the pull-down holding module, and the bootstrap capacitor module are electrically connected to an Nth-stage gate signal node Qn and an Nth-stage horizontal scan line Gn, respectively. The pull-up control module and the transferring module are connected to the Nth-stage gate signal node Qn.

12 Claims, 2 Drawing Sheets

GOA DRIVER CIRCUIT AND LIQUID CRYSTAL DISPLAY

BACKGROUND

1. Field of the Disclosure

The present disclosure relates to the field of liquid crystal display, and more particularly, to a gate driver on array (GOA) driver circuit and a liquid crystal display (LCD).

2. Description of the Related Art

The gate driver on array (GOA) technique is that a gate driver circuit is formed in an array substrate based on the conventional transistor LCD array process. Pixels can be scanned row by row with the GOA technique.

With the development of the technology, a narrow bezel is a natural trend to the industry. In the related art, a GOA driver circuit includes more transistors. However, it is a problem that too many transistors are used. How to reduce the use of the transistors without affecting the functions of the GOA driver circuit should be taken into consideration.

Therefore, it is urgent to improve the related art with defects.

SUMMARY

An object of the present disclosure is to propose a gate driver on array (GOA) driver circuit and a liquid crystal display (LCD).

According to the present disclosure, a gate driver on array (GOA) driver circuit includes a plurality of cascaded GOA units. A gate driver signal is output to an Nth-stage horizontal scan line Gn on a display zone according to an Nth-stage GOA unit output gate driver signal; the Nth-stage GOA unit comprises a pull-up module, a pull-up control module, a pull-down holding module, a transferring module, and a bootstrap capacitor module. The pull-up module, the pull-down holding module, and the bootstrap capacitor module are electrically connected to an Nth-stage gate signal node Qn; the pull-up module, the pull-down holding module, and the bootstrap capacitor module are electrically connected to an Nth-stage horizontal scan line Gn. The pull-up control module and the transferring module are connected to the Nth-stage gate signal node Qn.

The pull-down holding module comprises a first transistor, a second transistor, a third transistor, a fourth transistor, a fifth transistor, a sixth transistor, a seventh transistor, an eighth transistor, a tenth transistor, a sixteenth transistor, and a seventeenth transistor. A gate and a drain of the first transistor and a drain of the second transistor are connected with an Nth-stage low-frequency clock signal LCn. A source of the first transistor, a gate of the second transistor, and a drain of the fourth transistor are connected. A source of the second transistor, a drain of the third transistor, a gate of the fifth transistor, a gate of the seventh transistor all are connected to an Nth-stage common node Pn. A drain of the seventh transistor and a drain of the eighth transistor are connected to the Nth-stage gate signal node Qn. A drain of the fifth transistor and a drain of the tenth transistor both are connected to the Nth-stage horizontal scan line. A source of the third transistor, a source of the fourth transistor, a source of the fifth transistor, a source of the seventh transistor, a source of the eighth transistor, and a source of the tenth transistor all are connected to a low supply voltage source to receive a low supply voltage.

A drain of the sixteenth transistor is connected to the Nth-stage common node Pn. A gate of the sixteenth transistor is connected to the low supply voltage source to receive the low supply voltage. A gate of the sixteenth transistor is connected to an (N+1)th-stage gate signal node Qn+1.

A drain of the seventeenth transistor, a source of the first transistor, and a gate of the second transistor are connected. A gate of the seventeenth transistor is connected to the low supply voltage source to receive the low supply voltage. The gate of the seventeenth transistor is connected to the (N+1)th-stage gate signal node Qn+1.

A gate of the eighth transistor and a gate of the tenth transistor is connected to an (N+1)th-stage common node Pn+1; the Nth-stage low-frequency clock signal LCn received by the Nth-stage GOA unit is inverted to the (N+1)th-stage low-frequency clock signal LCn+1 received by the (N+1)th-stage GOA unit.

Optionally, the pull-down holding module further comprises a sixth transistor and a ninth transistor. A transferring module comprises an eleventh transistor. The sixth transistor and the ninth transistor are connected to a source of the eleventh transistor. A gate of the sixth transistor is connected to the Nth-stage common node Pn. A gate of the ninth transistor is connected to the (N+1)th-stage common node Pn+1. A drain of the eleventh transistor receives a first high-frequency clock signal; a gate of the eleventh transistor is connected to an Nth-stage gate signal node Qn.

Optionally, the pull-up control module comprises a thirteenth transistor, a fourteenth transistor, and a fifteenth transistor. A gate of the thirteenth transistor and a gate of the fourteenth transistor are connected and receive a second high-frequency clock signal XCK; A source of the thirteenth transistor, a drain of the fourteenth transistor, and a drain of the fifteenth transistor are connected. A source of the fifteenth transistor, a drain of the fifth transistor, and a drain of the ninth transistor are connected. A source of the fourteenth transistor is connected to the Nth-stage gate signal node Qn.

Optionally, the low supply voltage comprises a first low supply voltage VSS1 and a second low supply voltage VSS2.

A source of the third transistor and a source of the sixteenth transistor receive the second low supply voltage VSS2. The source of the seventh transistor, the source of the sixth transistor, the source of the fifth transistor, the source of the eighth transistor, the source of the ninth transistor, and the source of the tenth transistor all receive the first low supply voltage VSS1. A value of the second low supply voltage VSS2 is smaller than a value of the first low supply voltage VSS1.

Optionally, the pull-up module comprises a twelve transistor. A drain of the twelve transistor receives a first high-level signal. A source of the twelve transistor is connected to the Nth-stage horizontal scan line. A gate of the twelve transistor is connected to the Nth-stage signal.

Optionally, the first high-frequency clock signal is inverted to the second high-frequency clock signal.

Optionally, the first high-frequency clock signal and the second high-frequency clock are received through a first common metallic line and a second common metallic line, respectively.

Optionally, the bootstrap capacitor module comprises a bootstrap capacitor connected between the Nth-stage gate signal node Qn and the Nth-stage horizontal scan line On.

Optionally, the Nth-stage low-frequency clock signal LCn is received through a third common metallic line.

According to the present disclosure, a gate driver on array (GOA) driver circuit includes a plurality of cascaded GOA units. A gate driver signal is output to an Nth-stage horizontal scan line Gn on a display zone according to an Nth-stage GOA unit output gate driver signal; the Nth-stage GOA unit comprises a pull-up module, a pull-up control module, a pull-down holding module, a transferring module, and a bootstrap capacitor module. The pull-up module, the pull-down holding module, and the bootstrap capacitor module are electrically connected to an Nth-stage gate signal node Qn; the pull-up module, the pull-down holding module, and the bootstrap capacitor module are electrically connected to an Nth-stage horizontal scan line Gn. The pull-up control module and the transferring module are connected to the Nth-stage gate signal node Qn.

The pull-down holding module comprises a first transistor, a second transistor, a third transistor, a fourth transistor, a fifth transistor, a sixth transistor, a seventh transistor, an eighth transistor, a tenth transistor, a sixteenth transistor, and a seventeenth transistor. A gate and a drain of the first transistor and a drain of the second transistor are connected with an Nth-stage low-frequency clock signal LCn. A source of the first transistor, a gate of the second transistor, and a drain of the fourth transistor are connected. A source of the second transistor, a drain of the third transistor, a gate of the fifth transistor, a gate of the seventh transistor all are connected to an Nth-stage common node Pn. A drain of the seventh transistor and a drain of the eighth transistor are connected to the Nth-stage gate signal node Qn. A drain of the fifth transistor and a drain of the tenth transistor both are connected to the Nth-stage horizontal scan line. A source of the third transistor, a source of the fourth transistor, a source of the fifth transistor, a source of the seventh transistor, a source of the eighth transistor, and a source of the tenth transistor all are connected to a low supply voltage source to receive a low supply voltage.

A drain of the sixteenth transistor is connected to the Nth-stage common node Pn. A gate of the sixteenth transistor is connected to the low supply voltage source to receive the low supply voltage. A gate of the sixteenth transistor is connected to an (N+1)th-stage gate signal node Qn+1.

A drain of the seventeenth transistor, a source of the first transistor, and a gate of the second transistor are connected. A gate of the seventeenth transistor is connected to the low supply voltage source to receive the low supply voltage. The gate of the seventeenth transistor is connected to the (N+1)th-stage gate signal node Qn+1.

A gate of the eighth transistor and a gate of the tenth transistor is connected to an (N+1)th-stage common node Pn+1; the Nth-stage low-frequency clock signal LCn received by the Nth-stage GOA unit is inverted to the (N+1)th-stage low-frequency clock signal LCn+1 received by the (N+1)th-stage GOA unit.

The pull-down holding module further comprises a sixth transistor and a ninth transistor. A transferring module comprises an eleventh transistor. The sixth transistor and the ninth transistor are connected to a source of the eleventh transistor. A gate of the sixth transistor is connected to the Nth-stage common node Pn. A gate of the ninth transistor is connected to the (N+1)th-stage common node Pn+1. A drain of the eleventh transistor receives a first high-frequency clock signal; a gate of the eleventh transistor is connected to an Nth-stage gate signal node Qn.

The pull-up control module comprises a thirteenth transistor, a fourteenth transistor, and a fifteenth transistor. A gate of the thirteenth transistor and a gate of the fourteenth transistor are connected and receive a second high-frequency clock signal XCK; A source of the thirteenth transistor, a drain of the fourteenth transistor, and a drain of the fifteenth transistor are connected. A source of the fifteenth transistor, a drain of the fifth transistor, and a drain of the ninth transistor are connected. A source of the fourteenth transistor is connected to the Nth-stage gate signal node Qn.

The law supply voltage comprises a first low supply voltage VSS1 and a second low supply voltage VSS2.

A source of the third transistor and a source of the sixteenth transistor receive the second low supply voltage VSS2. The source of the seventh transistor, the source of the sixth transistor, the source of the fifth transistor, the source of the eighth transistor, the source of the ninth transistor, and the source of the tenth transistor all receive the first low supply voltage VSS1. A value of the second low supply voltage VSS2 is smaller than a value of the first low supply voltage VSS1.

The pull-up module comprises a twelve transistor. A drain of the twelve transistor receives a first high-level signal. A source of the twelve transistor is connected to the Nth-stage horizontal scan line. A gate of the twelve transistor is connected to the Nth-stage signal.

The first high-frequency clock signal is inverted to the second high-frequency clock signal.

The first high-frequency clock signal and the second high-frequency clock are received through a first common metallic line and a second common metallic line, respectively.

The bootstrap capacitor module comprises a bootstrap capacitor connected between the Nth-stage gate signal node Qn and the Nth-stage horizontal scan line Gn.

The Nth-stage low-frequency clock signal LCn is received through a third common metallic line.

The present disclosure also proposes a liquid crystal display comprising a gate driver on array (GOA) driver circuit as disclosed above.

The GOA driver circuit proposed by the present disclosure share an (N+1)th-stage common node Pn+1 of a pull-down holding module of an (N+1)th-stage GOA unit through a pull-down holding module of an Nth-stage GOA unit. It is sufficient to time-share the work of a fifth transistor, a seventh transistor, an eighth transistor, and a tenth transistor on the condition that each of the pull-down holding modules only uses a set of four transistors. The fifth transistor, the seventh transistor, the eighth transistor, and the tenth transistor are prevented from become ineffective even though these transistors keep working. In this way, fewer transistors are used in the GOA driver circuit compared with the related art.

DETAILED DESCRIPTION OF THE PREFERRED EMBODIMENTS

Figure 1:
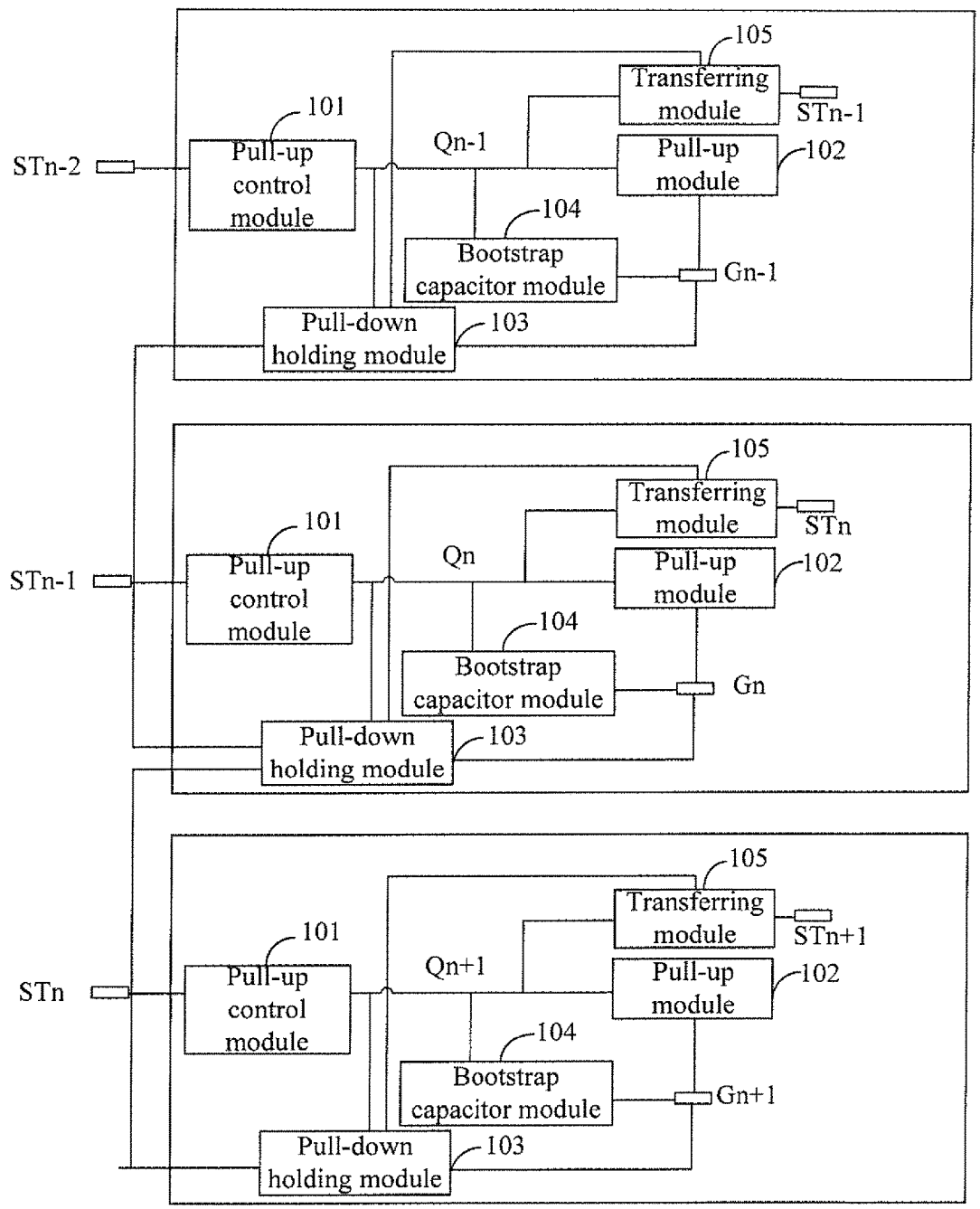
FIG. 1 illustrates a block diagram of a gate driver on array (GOA) driver circuit according to a preferred embodiment of the present disclosure.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

In the drawings, the components having similar structures are denoted by the same numerals.

Please refer to FIG. 1. A gate driver on array (GOA) driver circuit includes a plurality of cascaded GOA units. A gate driver signal is output to an Nth-stage horizontal scan line Gn on a display zone according to an Nth-stage GOA unit output gate driver signal. The Nth-stage GOA unit includes a pull-up control module 101, a pull-up module 102, a pull-down holding module 103, a transferring module 105, and a bootstrap capacitor module 104. The pull-up module 102, the pull-down holding module 103, and the bootstrap capacitor module 104 are connected to an Nth-stage gate signal node Qn. Also, the pull-up module 102, the pull-down holding module 103, and the bootstrap capacitor module 104 are electrically connected to an Nth-stage horizontal scan line Gn. The pull-up control module 101 and the transferring module 105 are electrically connected to the Nth-stage gate signal node Qn. The pull-down holding module 103 is further connected to the transferring module 105.

Figure 2:
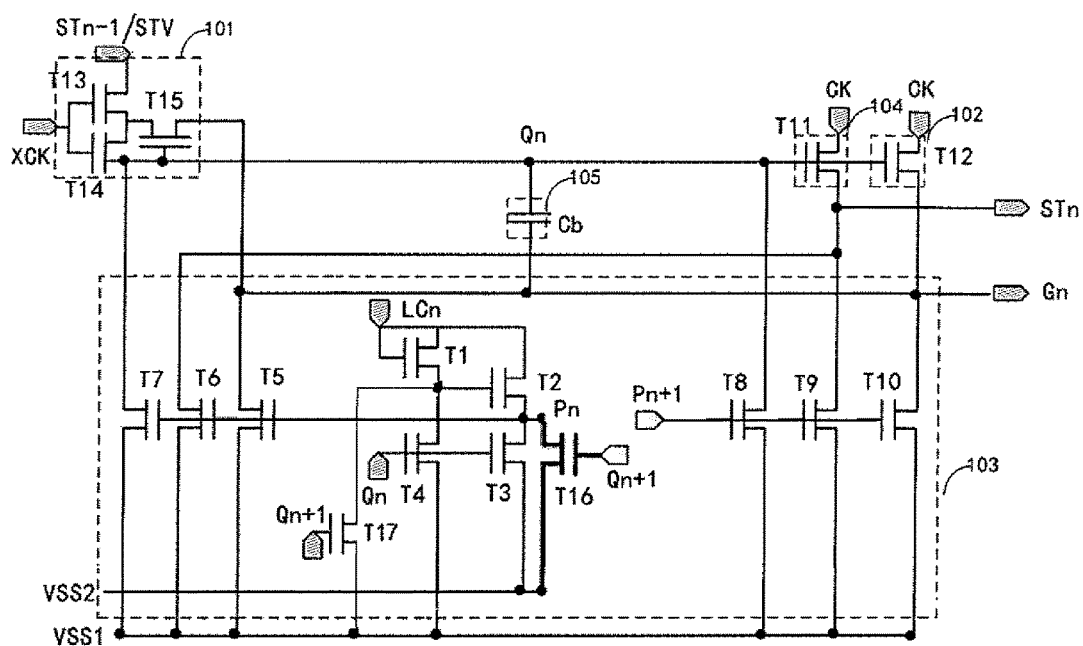
FIG. 2 illustrates a circuit diagram of an Nth stage GOA unit according to a preferred embodiment of the present disclosure.

Please refer to FIG. 2. The pull-down module 102 includes a twelve transistor T12. A gate of the twelve transistor T12 is connected to an Nth-stage gate signal node Qn. A source of the twelve transistor T12 is connected to an Nth-stage horizontal scan line Gn. The pull-down module 102 is used to output a first high-frequency clock signal CK as a gate scan signal to the Nth-stage horizontal scan line Gn.

The transferring module 105 includes an eleventh transistor T11. A gate of the eleventh transistor T11 is connected to an Nth-stage gate signal node Qn. A drain of the eleventh transistor T11 is connected to the first high-frequency clock signal CK. A source of the eleventh transistor T11 is connected to an Nth-stage pass-down signal STn.

The pull-up control module 101 includes a thirteenth transistor T13, a fourteenth transistor T14, and a fifteenth transistor T15. A gate of the thirteenth transistor T13 and a gate of the fourteenth transistor T14 are connected. Also, both of the gate of the thirteenth transistor T13 and the gate of the fourteenth transistor T14 receive a second high-frequency clock signal XCK. The second high-frequency clock signal XCK and the first high-frequency clock signal CK have the same frequency and are in antiphase. A source of the thirteenth transistor T13, a drain of the fourteenth transistor T14, and a drain of the fifteenth transistor T15 are connected to one another. A source of the fifteenth transistor T15 is connected to the pull-down holding module 103. A source of the fourteenth transistor T14 is connected to the Nth-stage gate signal node Qn. When the Nth-stage GOA unit is the first-stage GOA unit, a drain of the thirteenth transistor T13 receives a turn-on signal STV. When the Nth-stage GOA unit is the first-stage GOA unit, the drain of the thirteenth transistor T13 receives a pass-down signal output by the transferring module 105 of the N-1th-stage GOA unit.

The bootstrap capacitor module 105 includes a bootstrap capacitor Cb. One terminal of the bootstrap capacitor Cb is connected to the Nth-stage gate signal node Qn. The other terminal of the bootstrap capacitor Cb is connected to the Nth-stage horizontal scan line Gn.

The pull-down holding module 103 includes a first transistor T1, a second transistor T2, a third transistor T3, a fourth transistor T4, a fifth transistor T5, a sixth transistor T6, a seventh transistor T7, an eighth transistor T8, a ninth transistor T9, a tenth transistor T10, a sixteenth transistor T16, and a seventeenth transistor T17.

A gate and a drain of the first transistor T1 both are connected and a drain of the second transistor T2. Also, both of the gate and the drain of the first transistor T1 receive an Nth-stage low-frequency clock signal LCn. The source of the first transistor T1, the gate of the second transistor T2, and the drain of the fourth transistor T4 are connected to one another. The source of the second transistor T2, the drain of the third transistor T3, the gate of the fifth transistor T5, the gate of the sixth transistor T6, and the gate of the seventh transistor T7 all are connected to an Nth-stage common node Pn.

A drain of the seventh transistor T7 and a drain of the eighth transistor T8 both are connected to the Nth-stage gate signal node Qn. The design aims to pull down a voltage imposed on the Nth-stage gate signal node Qn after the row finishes being scanned.

A drain of the fifth transistor T5 and a drain of the tenth transistor T10 both are connected to the Nth-stage horizontal scan line Gn. The design aims to pull down a voltage imposed on the Nth-stage horizontal scan line Gn after the row finishes being scanned. Both of the drain of the fifth transistor T5 and the drain of the tenth transistor T10 are connected to the source of the fifteenth transistor T15. The design aims to pull down a voltage imposed on the source of the fifteenth transistor T15 so as to prevent the pull-up control module 101 from leaking electricity to the Nth-stage gate signal node Qn.

A drain of the sixth transistor T6 and a drain of the ninth transistor T9 both are connected to the source of the eleventh transistor T11. The design aims to pull down an output voltage imposed on the transferring module 105 after the scanning act finishes.

The source of the third transistor T3, the source of the fourth transistor T4, the source of the fifth transistor T5, the source of the sixth transistor T6, the source of the seventh transistor T7, the source of the eighth transistor T8, the source of the ninth transistor T9, and the source of the tenth transistor T10 all are connected to receive a low supply voltage. Specifically, the low supply voltage includes a first low supply voltage VSS1 and a second low supply voltage VSS2. The source of the third transistor T3 and the source of the sixteenth transistor T16 receive the second low supply voltage VSS2. The source of the seventh transistor T7, the source of the sixth transistor T6, the source of the fifth transistor T5, the source of the eighth transistor T8, the source of the ninth transistor T9, and the source of the tenth transistor T10 all receive the first low supply voltage VSS1. The value of the second low supply voltage VSS2 is smaller than the value of the first low supply voltage VSS1.

A drain of the seventeenth transistor T17, the source of the first transistor T1, and the gate of the second transistor T2 are connected to one another. The gate of the seventeenth transistor T17 and a low supply voltage source are connected to receive a low supply voltage. The gate of the seventeenth transistor T17 is connected to an (N+1)th-stage gate signal node Qn+1.

The sixteenth transistor T16 is used to pull down the Nth-stage common node Pn forcefully when an N+1 row is scanned.

The seventeenth transistor T1 is used to pull down the voltage on a node formed by the connection of the source of the first transistor T1 and the gate of the second transistor T2 forcefully when an N+1 row is scanned.

The gate of the eighth transistor T8, the gate of the ninth transistor T9, and the gate of the tenth transistor T10 all are connected to one another and connected to an (N+1)th-stage common node Pn+1 so that the pull-down holding modules of two adjacent GOA units can share the potential of the common node P. In this way, the number of transistors used in the present disclosure reduces. The Nth-stage low-frequency clock signal LCn received by the Nth-stage GOA unit and the (N+1)th-stage low-frequency clock signal LCn+1 received by the (N+1)th-stage GOA unit have the same frequency and are in antiphase so some of the transistors of the pull-down holding module 103 of two adjacent GOA units can work alternatively. Therefore, the transistors can still work normally and effectively in the long-time working condition.

The GOA driver circuit proposed by the present disclosure share an (N+1)th-stage common node Pn+1 of a pull-down holding module of an (N+1)th-stage GOA unit through a pull-down holding module of an Nth-stage GOA unit. It is sufficient to time-share the work of a fifth transistor, a seventh transistor, an eighth transistor, and a tenth transistor on the condition that each of the pull-down holding modules only uses a set of four transistors. The fifth transistor, the seventh transistor, the eighth transistor, and the tenth transistor are prevented from become ineffective even though these transistors keep working. In this way, fewer transistors are used in the GOA driver circuit compared with the related art.

As the above, it should be understood that the present disclosure has been described with reference to certain preferred and alternative embodiments which are intended to be exemplary only and do not limit the full scope of the present disclosure as set fourth in the appended claims.

What is claimed is:

1. A gate driver on array (GOA) driver circuit, comprising a plurality of cascaded GOA units, wherein a gate driver signal is output to an Nth-stage horizontal scan line Gn on a display zone according to an Nth-stage GOA unit output gate driver signal; the Nth-stage GOA unit comprises a pull-up module, a pull-up control module, a pull-down holding module, a transferring module, and a bootstrap capacitor module; the pull-up module, the pull-down holding module, and the bootstrap capacitor module are electrically connected to an Nth-stage gate signal node Qn; the pull-up module, the pull-down holding module, and the bootstrap capacitor module are electrically connected to an Nth-stage horizontal scan line Gn; the pull-up control module and the transferring module are connected to the Nth-stage gate signal node Qn, wherein the pull-down holding module comprises a first transistor, a second transistor, a third transistor, a fourth transistor, a fifth transistor, a sixth transistor, a seventh transistor, an eighth transistor, a tenth transistor, a sixteenth transistor, and a seventeenth transistor; a gate and a drain of the first transistor and a drain of the second transistor are connected with an Nth-stage low-frequency clock signal LCn; a source of the first transistor, a gate of the second transistor, and a drain of the fourth transistor are connected; a source of the second transistor, a drain of the third transistor, a gate of the fifth transistor, a gate of the seventh transistor all are connected to an Nth-stage common node Pn; a drain of the seventh transistor and a drain of the eighth transistor are connected to the Nth-stage gate signal node Qn; a drain of the fifth transistor and a drain of the tenth transistor both are connected to the Nth-stage horizontal scan line; a source of the third transistor, a source of the fourth transistor, a source of the fifth transistor, a source of the seventh transistor, a source of the eighth transistor, and a source of the tenth transistor all are connected to a low supply voltage source to receive a low supply voltage;

a drain of the sixteenth transistor is connected to the Nth-stage common node Pn; a gate of the sixteenth transistor is connected to the low supply voltage source to receive the low supply voltage; a gate of the sixteenth transistor is connected to an (N+1)th-stage gate signal node Qn+1;

a drain of the seventeenth transistor, a source of the first transistor, and a gate of the second transistor are connected; a gate of the seventeenth transistor is connected to the low supply voltage source to receive the low supply voltage; the gate of the seventeenth transistor is connected to the (N+1)th-stage gate signal node Qn+1;

a gate of the eighth transistor and a gate of the tenth transistor is connected to an (N+1)th-stage common node Pn+1; the Nth-stage low-frequency clock signal LCn received by the Nth-stage GOA unit is inverted to the (N+1)th-stage low-frequency clock signal LCn+1 received by the (N+1)th-stage GOA unit.

2. The GOA driver circuit of claim 1, wherein the pull-down holding module further comprises a sixth transistor and a ninth transistor; a transferring module comprises an eleventh transistor; the sixth transistor and the ninth transistor are connected to a source of the eleventh transistor; a gate of the sixth transistor is connected to the Nth-stage common node Pn; a gate of the ninth transistor is connected to the (N+1)th-stage common node Pn+1; a drain of the eleventh transistor receives a first high-frequency clock signal; a gate of the eleventh transistor is connected to an Nth-stage gate signal node Qn.

3. The GOA driver circuit of claim 2, wherein the pull-up control module comprises a thirteenth transistor, a fourteenth transistor, and a fifteenth transistor; a gate of the thirteenth transistor and a gate of the fourteenth transistor are connected and receive a second high-frequency clock signal XCK; a source of the thirteenth transistor, a drain of the fourteenth transistor, and a drain of the fifteenth transistor are connected; a source of the fifteenth transistor, a drain of the fifth transistor, and a drain of the ninth transistor are connected; a source of the fourteenth transistor is connected to the Nth-stage gate signal node Qn.

4. The GOA driver circuit of claim 3, wherein the low supply voltage comprises a first low supply voltage VSS1 and a second low supply voltage VSS2;

a source of the third transistor and a source of the sixteenth transistor receive the second low supply voltage VSS2; the source of the seventh transistor, the source of the sixth transistor, the source of the fifth transistor, the source of the eighth transistor, the source of the ninth transistor, and the source of the tenth transistor all receive the first low supply voltage VSS1; a value of the second low supply voltage VSS2 is smaller than a value of the first low supply voltage VSS1.

5. The GOA driver circuit of claim 4, wherein the pull-up module comprises a twelve transistor; a drain of the twelve transistor receives a first high-level signal; a source of the twelve transistor is connected to the Nth-stage horizontal scan line; a gate of the twelve transistor is connected to the Nth-stage signal.

6. The GOA driver circuit of claim 3, wherein the first high-frequency clock signal is inverted to the second high-frequency clock signal.

7. The GOA driver circuit of claim 6, wherein the first high-frequency clock signal and the second high-frequency clock are received through a first common metallic line and a second common metallic line, respectively.

8. The GOA driver circuit of claim 1, wherein the bootstrap capacitor module comprises a bootstrap capacitor connected between the Nth-stage gate signal node Qn and the Nth-stage horizontal scan line Gn.

9. The GOA driver circuit of claim 1, wherein the Nth-stage low-frequency clock signal LCn is received through a third common metallic line.

10. A gate driver on array (GOA) driver circuit, comprising a plurality of cascaded GOA units, wherein a gate driver signal is output to an Nth-stage horizontal scan line Gn on a display zone according to an Nth-stage GOA unit output gate driver signal; the Nth-stage GOA unit comprises a pull-up module, a pull-up control module, a pull-down holding module, a transferring module, and a bootstrap capacitor module; the pull-up module, the pull-down holding module, and the bootstrap capacitor module are electrically connected to an Nth-stage gate signal node Qn; the pull-up module, the pull-down holding module, and the bootstrap capacitor module are electrically connected to an Nth-stage horizontal scan line Gn; the pull-up control module and the transferring module are connected to the Nth-stage gate signal node Qn, wherein the pull-down holding module comprises a first transistor, a second transistor, a third transistor, a fourth transistor, a fifth transistor, a sixth transistor, a seventh transistor, an eighth transistor, a tenth transistor, a sixteenth transistor, and a seventeenth transistor; a gate and a drain of the first transistor and a drain of the second transistor are connected with an Nth-stage low-frequency clock signal LCn; a source of the first transistor, a gate of the second transistor, and a drain of the fourth transistor are connected; a source of the second transistor, a drain of the third transistor, a gate of the fifth transistor, a gate of the seventh transistor all are connected to an Nth-stage common node Pn; a drain of the seventh transistor and a drain of the eighth transistor are connected to the Nth-stage gate signal node Qn; a drain of the fifth transistor and a drain of the tenth transistor both are connected to the Nth-stage horizontal scan line; a source of the third transistor, a source of the fourth transistor, a source of the fifth transistor, a source of the seventh transistor, a source of the eighth transistor, and a source of the tenth transistor all are connected to a low supply voltage source to receive a low supply voltage;

a drain of the sixteenth transistor is connected to the Nth-stage common node Pn; a gate of the sixteenth transistor is connected to the low supply voltage source to receive the low supply voltage; a gate of the sixteenth transistor is connected to an (N+1)th-stage gate signal node Qn+1;

a drain of the seventeenth transistor, a source of the first transistor, and a gate of the second transistor are connected; a gate of the seventeenth transistor is connected to the low supply voltage source to receive the low supply voltage; the gate of the seventeenth transistor is connected to the (N+1)th-stage gate signal node Qn+1;

a gate of the eighth transistor and a gate of the tenth transistor is connected to an (N+1)th-stage common node Pn+1; the Nth-stage low-frequency clock signal LCn received by the Nth-stage GOA unit is inverted to the (N+1)th-stage low-frequency clock signal LCn+1 received by the (N+1)th-stage GOA unit, wherein the pull-down holding module further comprises a sixth transistor and a ninth transistor; a transferring module comprises an eleventh transistor; the sixth transistor and the ninth transistor are connected to a source of the eleventh transistor; a gate of the sixth transistor is connected to the Nth-stage common node Pn; a gate of the ninth transistor is connected to the (N+1)th-stage common node Pn+1; a drain of the eleventh transistor receives a first high-frequency clock signal; a gate of the eleventh transistor is connected to an Nth-stage gate signal node Qn, wherein the pull-up control module comprises a thirteenth transistor, a fourteenth transistor, and a fifteenth transistor; a gate of the thirteenth transistor and a gate of the fourteenth transistor are connected and receive a second high-frequency clock signal XCK; a source of the thirteenth transistor, a drain of the fourteenth transistor, and a drain of the fifteenth transistor are connected; a source of the fifteenth transistor, a drain of the fifth transistor, and a drain of the ninth transistor are connected; a source of the fourteenth transistor is connected to the Nth-stage gate signal node Qn, wherein the low supply voltage comprises a first low supply voltage VSS1 and a second low supply voltage VSS2;

a source of the third transistor and a source of the sixteenth transistor receive the second low supply voltage VSS2; the source of the seventh transistor, the source of the sixth transistor, the source of the fifth transistor, the source of the eighth transistor, the source of the ninth transistor, and the source of the tenth transistor all receive the first low supply voltage VSS1; a value of the second low supply voltage VSS2 is smaller than a value of the first low supply voltage VSS1, wherein the pull-up module comprises a twelve transistor; a drain of the twelve transistor receives a first high-level signal; a source of the twelve transistor is connected to the Nth-stage horizontal scan line; a gate of the twelve transistor is connected to the Nth-stage signal, wherein the first high-frequency clock signal is inverted to the second high-frequency clock signal, wherein the first high-frequency clock signal and the second high-frequency clock are received through a first common metallic line and a second common metallic line, respectively, wherein the bootstrap capacitor module comprises a bootstrap capacitor connected between the Nth-stage gate signal node Qn and the Nth-stage horizontal scan line Gn, and wherein the Nth-stage low-frequency clock signal LCn is received through a third common metallic line.

11. A liquid crystal display comprising a gate driver on array (GOA) driver circuit as claimed in claim 1.

12. A liquid crystal display comprising a gate driver on array (GOA) driver circuit as claimed in claim 10.

* * * * *